(12) United States Patent
Lo

(10) Patent No.: US 9,362,479 B2
(45) Date of Patent: Jun. 7, 2016

(54) PACKAGE-IN-PACKAGE SEMICONDUCTOR SENSOR DEVICE

(71) Applicant: Wai Yew Lo, Petaling Jaya (MY)

(72) Inventor: Wai Yew Lo, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 175 days.

(21) Appl. No.: 14/337,225

(22) Filed: Jul. 22, 2014

(65) Prior Publication Data

US 2016/0027992 A1    Jan. 28, 2016

(51) Int. Cl.
| | |
|---|---|
| *G01P 15/08* | (2006.01) |
| *H01L 41/113* | (2006.01) |
| *H01L 41/23* | (2013.01) |
| *H01L 41/25* | (2013.01) |
| *H01L 41/053* | (2006.01) |
| *H01L 41/04* | (2006.01) |

(52) U.S. Cl.
CPC .......... *H01L 41/1132* (2013.01); *H01L 41/042* (2013.01); *H01L 41/0533* (2013.01); *H01L 41/23* (2013.01); *H01L 41/25* (2013.01)

(58) Field of Classification Search
CPC ..... H01L 41/1132; H01L 41/23; H01L 41/25; H01L 41/0533; H01L 41/042
USPC .............................................. 257/417; 438/51
See application file for complete search history.

(56) References Cited

U.S. PATENT DOCUMENTS

| | | | |
|---|---|---|---|
| 4,314,225 A | 2/1982 | Tominaga | |
| 5,604,363 A | 2/1997 | Ichihashi | |
| 5,625,209 A | 4/1997 | Appleton | |
| 5,692,637 A | 12/1997 | Hodge | |
| 5,719,069 A | 2/1998 | Sparks | |
| 5,811,684 A | 9/1998 | Sokn | |
| 5,831,170 A | 11/1998 | Sokn | |
| 5,859,759 A | 1/1999 | Moriyama | |
| 5,874,679 A | 2/1999 | Sokn | |
| 5,996,419 A | 12/1999 | Sokn | |
| 6,094,356 A | 7/2000 | Fujisawa | |
| 6,266,197 B1 | 7/2001 | Glenn | |
| 6,351,996 B1 | 3/2002 | Nasiri | |
| 6,401,545 B1 | 6/2002 | Monk | |
| 6,432,737 B1 | 8/2002 | Webster | |
| 6,566,168 B2 | 5/2003 | Gang | |
| 6,667,439 B2 | 12/2003 | Salatino | |
| 6,900,531 B2 | 5/2005 | Foong | |
| 6,927,482 B1 | 8/2005 | Kim | |
| 7,014,888 B2 | 3/2006 | McDonald | |
| 7,462,940 B2 | 12/2008 | Bauer | |
| 7,469,590 B2 | 12/2008 | Fukuda | |
| 7,549,344 B2 | 6/2009 | Yamamoto | |
| 7,568,390 B2 | 8/2009 | Shizuno | |
| 7,579,267 B2 | 8/2009 | Wood | |
| 7,632,698 B2 | 12/2009 | Hooper | |
| 7,673,519 B1 | 3/2010 | Fuhrmann | |
| 7,705,242 B2 | 4/2010 | Winterhalter | |

(Continued)

*Primary Examiner* — Vongsavanh Sengdara

(74) *Attorney, Agent, or Firm* — Charles E. Bergere

(57) ABSTRACT

A semiconductor sensor device includes a device substrate, a micro-controller unit (MCU) die attached to the substrate, and a packaged pressure sensor having a sensor substrate and a pressure sensor die. The sensor substrate has a front side with the pressure sensor die attached to it, a back side, and an opening from the front side to the back side. A molding compound encapsulates the MCU die, the device substrate, and the packaged pressure sensor. A back side of the sensor substrate and the opening in the sensor substrate are exposed on an outer surface of the molding compound.

7 Claims, 4 Drawing Sheets

(56) References Cited

U.S. PATENT DOCUMENTS

| | | |
|---|---|---|
| 7,745,918 B1 | 6/2010 | Woodyard |
| 7,875,942 B2 | 1/2011 | Cortese |
| 7,886,609 B2 | 2/2011 | Lo |
| 8,035,235 B2 | 10/2011 | Jang |
| 8,359,927 B2 | 1/2013 | Hooper |
| 8,378,435 B2 | 2/2013 | Lo |
| 8,390,047 B2 | 3/2013 | Jain |
| 8,597,983 B2 | 12/2013 | Gong |
| 2004/0014266 A1 | 1/2004 | Uno |
| 2004/0187977 A1 | 9/2004 | Matsui |
| 2004/0245320 A1 | 12/2004 | Fukagaya |
| 2005/0236644 A1 | 10/2005 | Getten |
| 2007/0023873 A1 | 2/2007 | Park |
| 2007/0298276 A1 | 12/2007 | Teshima et al. |
| 2008/0050267 A1 | 2/2008 | Murai |
| 2009/0072399 A1 | 3/2009 | Terashima |
| 2009/0211784 A1 | 8/2009 | Grogl |
| 2012/0168884 A1 | 7/2012 | Yao |
| 2012/0306031 A1 | 12/2012 | Lo |
| 2013/0049182 A1 | 2/2013 | Gong |
| 2013/0277772 A1 | 10/2013 | Bryzek |
| 2013/0283912 A1* | 10/2013 | Lin .................... G01P 15/0802 73/514.16 |

* cited by examiner

PACKAGE-IN-PACKAGE SEMICONDUCTOR SENSOR DEVICE

BACKGROUND OF THE INVENTION

The present invention relates generally to semiconductor sensor devices and, more particularly, to a package-in-package semiconductor pressure sensor.

Semiconductor sensor devices, such as pressure sensors, are well known. Each such device contains a semiconductor pressure-sensing die. The pressure-sensing die is susceptible to mechanical damage during packaging and environmental damage when in use, and thus must be carefully packaged. Further, a pressure-sensing die, such as a piezo-resistive transducer or a parameterized layout cell (P-cell), does not allow full encapsulation because that would impede its functionality.

A conventional packaged semiconductor sensor device has a pressure-sensing die, possibly an acceleration-sensing die (G-cell), and a micro controller unit (MCU) die mounted to a substrate, electrically connected to package leads with bond wires, and covered by a pressure-sensitive gel, which enables the pressure of the ambient atmosphere to reach the pressure-sensitive active region on the top side of pressure-sensing die, while protecting all of the dies and the bond wires from mechanical damage during packaging and environmental damage (e.g., contamination and/or corrosion) when in use. The die/substrate assembly is encased in molding compound and covered by a metal lid having a vent hole that exposes the gel-covered pressure-sensing die to ambient atmospheric pressure outside the sensor device.

One problem with the design of conventional pressure sensors is the high manufacturing cost due to the pre-molded package base, the metal lid, and the large volume of pressure-sensitive gel. Accordingly, it would be advantageous to have a more economical way to package pressure-sensing dies in semiconductor sensor devices.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a", "an", and "the", are intended to include the plural forms as well, unless the context clearly indicates otherwise. It further will be understood that the terms "comprises", "comprising", "has", "having", "includes", or "including" specify the presence of stated features, steps, or components, but do not preclude the presence or addition of one or more other features, steps, or components. It also should be noted that, in some alternative implementations, the functions/acts noted might occur out of the order noted in the figures. For example, two figures shown in succession may in fact be executed substantially concurrently or may sometimes be executed in the reverse order, depending upon the functionality/acts involved. The term "or" is to be interpreted as inclusive unless indicated otherwise.

One embodiment of the invention is a method for manufacturing a semiconductor sensor device, the method including: a) providing a sensor substrate having a front side and a back side, b) forming an opening through the sensor substrate, c) flip-chip bonding a pressure sensor die to the front side of the sensor substrate, d) filling a region between the pressure sensor die and the sensor substrate with a pressure-sensitive gel, and e) encapsulating the sensor substrate, the pressure sensor die, and the pressure-sensitive gel with a molding compound, leaving the back side of the sensor substrate exposed.

Another embodiment of the invention is a semiconductor sensor device including: a) a device substrate, b) a micro controller unit (MCU) die attached to the device substrate, c) a pressure sensor package having a sensor substrate and a pressure sensor die, the sensor substrate having a front side with the pressure sensor die attached thereto, a back side, and an opening from the front side to the back side, and d) a molding compound encapsulating the MCU die, the device substrate, and the pressure sensor package, the molding compound having an outer surface. The back side of the sensor substrate and the opening in the sensor substrate are exposed on the outer surface of the molding compound.

Figure 1:
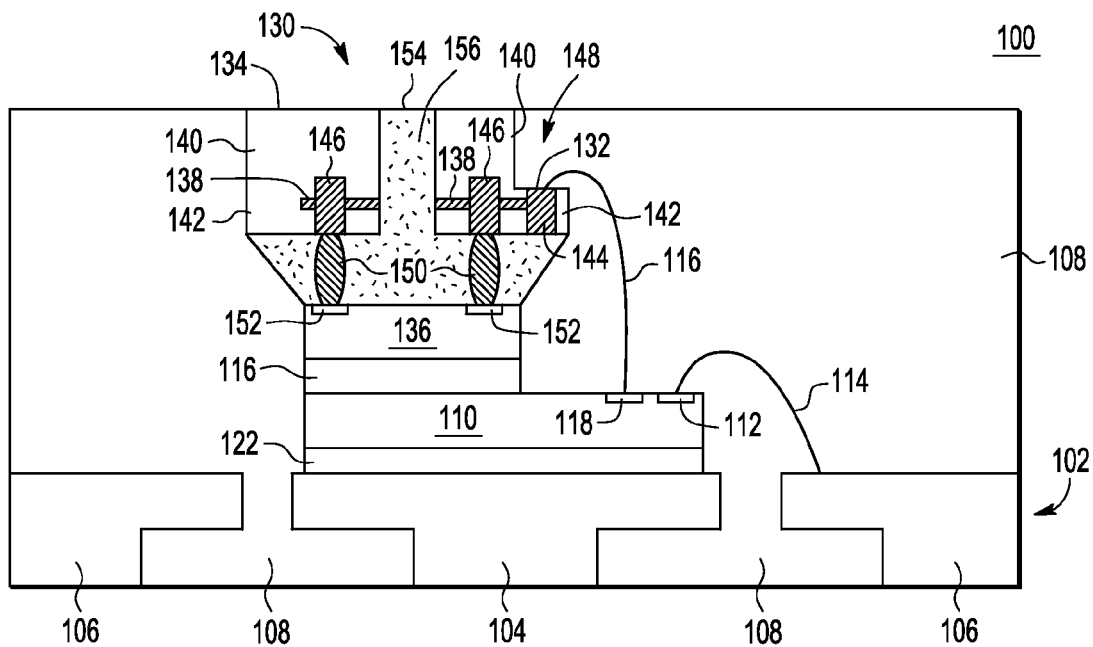
FIG. 1 shows a cross-sectional side view of a semiconductor sensor device, including a pressure sensor package, in accordance with an embodiment of the invention.

Referring now to FIG. 1, a cross-sectional side view of a packaged semiconductor sensor device 100 in accordance with an embodiment of the invention is shown. The exemplary configuration of sensor device 100 forms a no-leads type package such as a quad flat no-leads (QFN) package. Note that alternative embodiments are not limited to QFN packages, but can be implemented for other package types, such as (without limitation) ball grid array (BGA) packages, molded array packages (MAP), and quad flat pack (QFP) or other leaded packages.

The sensor device 100 comprises a lead frame 102 having a die paddle 104 and multiple metal leads 106 that generally surround the die paddle 104. The leads 106 are at least partially separated from the die paddle 104 and each other by and embedded within an electrically insulating molding compound 108 discussed in more detail below. The leads 106 may be formed of copper, an alloy of copper, a copper-plated iron/nickel alloy, plated aluminum, or the like. Often, copper leads are pre-plated first with a nickel base layer, then a palladium mid layer, and finally with a very thin, gold upper layer. The molding compound 108 may be an epoxy or other suitable material.

The lead frame 102 functions as a substrate to which other elements of the sensor device 100 are mounted. In particular, attached to the die paddle 104 is an MCU die 110, with one or more bond pads 112 on the MCU 110 that are electrically connected to one or more of the leads 106 with bond wires 114. A conventional, die-attach adhesive layer 122 may be used to attach the MCU 110 to the die paddle 104. Note that, in alternative designs, the MCU 110 can be electrically connected to the lead frame 102 using suitable flip-chip, metal-bump techniques instead of or in addition to wire-bonding.

On the MCU die 110 is a conventional insulating adhesive layer 116 that attaches a pre-packaged pressure sensor package 130 to the MCU die 110. One or more other bond pads 118 on the MCU 110 are electrically connected to one or more bond pads 132 on a pressure sensor package 130 with bond wires 116. The bond wires 114 and 116 are formed from a conductive material such as aluminium, silver, gold, or copper, and may be either coated or uncoated.

Those skilled in the art will understand that suitable alternative means, such as die-attach tape, may be used as one or both of the adhesive layers 116, 122.

The pressure sensor package 130, in one possible implementation, comprises a sensor substrate 134 and a P-cell 136 attached to the substrate 134 by metal bumps 150, described in more detail below. The substrate 134, in one embodiment, has a single, patterned metal layer 138 sandwiched between two insulating layers 140, 142 with one or more metal vias 144, 146 through at least insulating layer 142. The metal layer 138 and vias 144, 146 are typically made of copper or a copper alloy, and the insulating layers are typically made of a glass-epoxy-based material, e.g., FR4, because of its rigid nature and imperviousness to moisture and other environmental contaminants when cured.

In this embodiment, the metal vias 144 are formed in both layers 140 and 142. A shelf 148 is milled into the substrate 134 to remove portions of the layer 140 and vias 144, leaving the milled ends of the vias 144 planar with the remainder of layer 140 over the metal layer 138. The milled ends of metal vias 144 form the wire-bond pads 132 that are connected to the MCU 110 by bond wires 116.

In another embodiment, the vias 144 are not used because the process to form the shelf 148 might be sufficiently accurate to remove just enough of the insulating layer 140 to expose the metal layer 138 without removing a significant amount of the exposed metal layer 138. In this embodiment, the shelf 148 is milled or etched into the substrate 134 to expose metal traces formed in the patterned metal layer 138 with wire-bond pads 132 connected to the patterned metal traces. The wire-bond pads 132 exposed by the shelf 148 are connected to the MCU 110 by bond wires 116.

As shown in the embodiment in FIG. 1, the vias 146 extend completely through insulating layer 142 and above the metal layer 138 into at least a portion of the thickness of insulating layer 140. In another embodiment, the vias 146 extend completely through insulating layer 140 and, in another embodiment, the vias terminate on or near the metal layer 138, but, in all embodiments, the vias 146 are in contact with the metal traces in the metal layer 138.

Controlled collapse chip connection ("C4") metal bumps 150, attached to exposed portions of the metal vias 146 on one side of the substrate 134, are also attached to die pads 152 on the P-cell 136 to form a flip-chip structure. The bond wires 116, die pads 132, metal vias 144, patterned metal traces in layer 138, metal vias 146, and metal bumps 150 provide electrical interconnections between the wire-bond pads 118 of MCU 110 and the die pads 152 of P-cell 136. C4 metal bump technology is well known in the art and as such will not be explained in detail herein.

The P-cell 136 is designed to sense ambient atmospheric pressure and is a well-known component used semiconductor sensor devices and thus detailed descriptions thereof are not necessary for a complete understanding of the invention. One or more die pads 152 on P-cell 136 are electrically connected to a pressure-sensing active region (not shown) formed on the same face of the P-cell as the die pads 152. An opening 154 formed through the substrate 134 allows the ambient atmospheric pressure to reach the pressure-sensing active region in the P-cell 136 when the pressure sensor package 130 is integrated in the completed device 100.

Covering the surface of the P-cell 136, encapsulating the C4 bumps 150, and filling the opening 154 is a pressure-sensitive gel material 156, such as a silicone-based gel, which fills the cavity of pressure sensor package 130 and contacts the pressure-sensing active regions of the P-cell. Note that, in alternative implementations, less of gel material 156 may be applied within sensor package 130 as long as the pressure-sensitive active region of P-cell 136 and C4 bumps 150 are covered by the gel. Pressure-sensitive gel 156 enables the pressure of the ambient atmosphere to reach the active region of P-cell 136, while protecting P-cell 136 and the C4 bumps 150 from (i) mechanical damage during packaging and (ii) environmental damage (e.g., contamination and/or corrosion) when in use. Examples of suitable pressure-sensitive gel 156 are available from Dow Corning Corporation of Midland, Mich.

Figure 2:
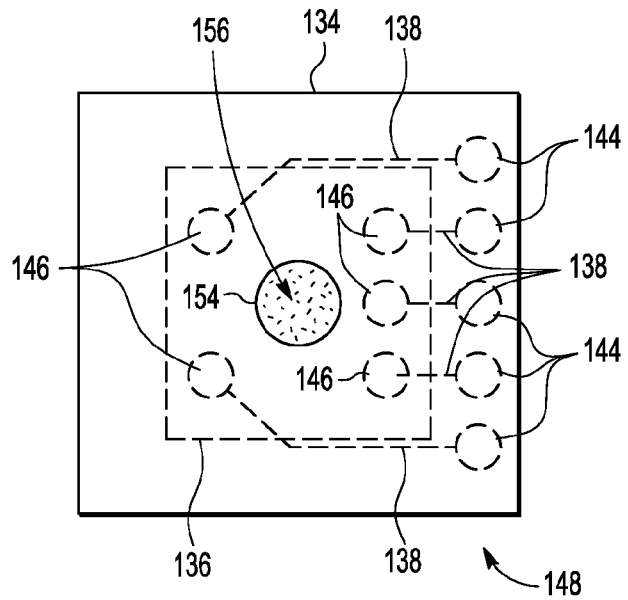
FIG. 2 shows an top "X-ray" view of the pressure sensor package of FIG. 1.

FIG. 2 shows a top "X-Ray" view of just the sensor package 130. The substrate 134 has vias 144 shown where the shelf 148 is formed in the substrate 134. The P-cell 136 is shown as a dashed outline beneath the substrate 134. Vias 146 are shown connecting the P-cell die pads (not shown) to the patterned traces in metal layer 138. Opening 154 is shown in the substrate 134 and containing the gel 156.

Returning to FIG. 1, lead frame 102, MCU 110, bond wires 114 and 116, and all but a portion of a surface of the prepackaged pressure sensor 130 are encapsulated in a suitable molding compound 108. That portion corresponds to the back side of the substrate 134, which remains exposed after the molding compound encapsulates the structure. This leaves the opening 154 exposed in the completed device 100 so that the P-cell 136 can detect the ambient atmospheric pressure. The molding compound may be a plastic, an epoxy, a silica-filled resin, a ceramic, a halide-free material, the like, or a combination thereof, as known in the art. As explained below in the context of FIG. 11, depending on the particular implementation, molding compound 108 may be applied in a single manufacturing step or in two different manufacturing steps.

The MCU 110 functions as the controller for the P-cell 136 by, for example, controlling the operations of and processing of signals generated by P-cell sensor die. Note that, in some embodiments, MCU 110 might implement both the functionality of an MCU and that of one or more other sensors, such as an acceleration-sensing sensor or G-cell. Note further that some embodiments may have one or more other dies (not shown), such as a G-cell, mounted either on the MCU 110 adjacent to the pressure sensor package 130 or on the die paddle 104 adjacent to the MCU. MCU 110 is a well-known component used semiconductor sensor devices and thus detailed descriptions thereof are not necessary for a complete understanding of the invention.

Sensor device 100 can be manufactured with less cost than comparable sensor devices because P-cell 136 is pre-packaged within a stand-alone pressure sensor package 130, allowing the P-cell 136 to be tested independently prior to being packaged within sensor device 100. Further, the device 100 is simpler than previous designs. For example, no special cover, such as a perforated metal cover, is used to protect the P-cell since it is the back side of the substrate 134 that is exposed on an outside surface of the sensor device 100, and the substrate 134 has the opening 154 to allow ambient atmospheric pressure to reach the P-cell. This arrangement allows the substrate to protect the P-cell 136 from damage while allowing the P-cell to sense pressure.

FIGS. 3-12 illustrate one possible process for manufacturing multiple instantiations of sensor device 100 of FIG. 1.

Figure 3:
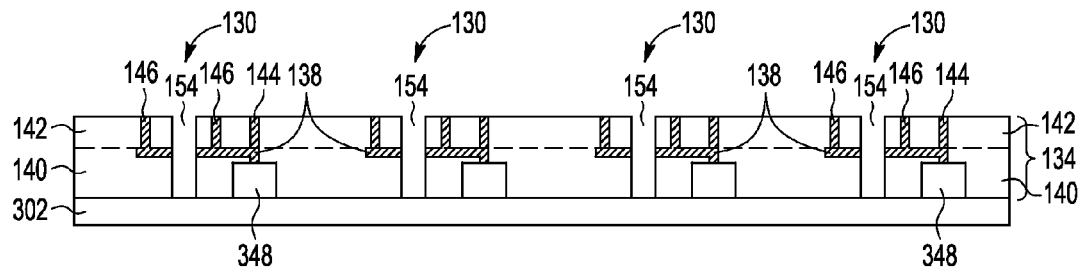
FIG. 3 is a cross-sectional side view illustrating a step in a process for assembling the sensor device of FIGS. 1 and 2 in accordance with an embodiment of the present invention.

FIG. 3 shows a cross-sectional side view of four exemplary sites where pressure sensor packages 130 will be fabricated on the substrate 134. For convenience, only four sites are shown although, in a real-world manufacturing process, many more such sites would be processed concurrently in a one- or two-dimensional array.

As described above, the pre-manufactured substrate 134 has a single patterned metal layer 138 sandwiched between two insulating layers 140, 142 with one or more metal vias 144, 146 through at least insulating layer 142. The metal vias 144 are exposed by a trench 348 milled or etched into the substrate 134 to expose, in one embodiment, ends of metal vias 144 to form wire-bond pads 132. The trench 348 will be, after singulation, the shelf 148 shown in FIG. 1.

In another embodiment similar to that shown in FIG. 1 and as described above, the trench 348 exposes only the portion of the metal layer 138 that corresponds to the wire-bond pads 132 connected to the patterned metal traces. Openings 154 are also present, passing through the substrate 134 from front to back. As shown here, the openings 154 and trench 348 are formed in the substrate 134 before a conventional backing tape 302 is applied. The backing tape, typically of polyimide, is used to assist in the processing of the substrate 134.

Figure 4:
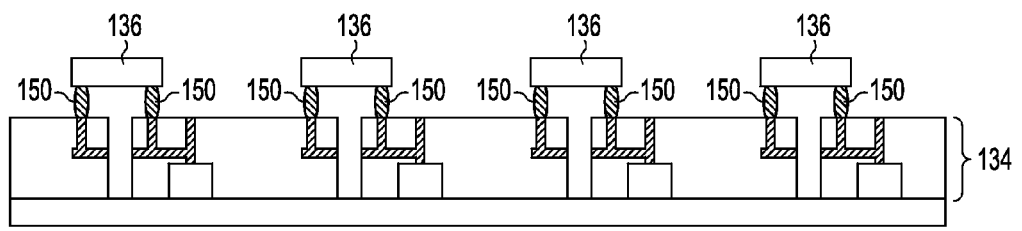
FIG. 4 is a cross-sectional side view illustrating another step in the process for assembling the sensor device of FIGS. 1 and 2 in accordance with an embodiment of the present invention.

FIG. 4 shows a cross-sectional side view of the structure shown in FIG. 3 but with the P-cells 136 flip-chip bonded to the exposed metal vias 146. Flip-chip bonding is a process known in the art for physically and electrically coupling die pads on the P-cells 136 to the exposed ends of the metal vias 146 using controlled collapse chip connection (C4) metal bumps 150. Each of the die pads is substantially aligned with a corresponding metal via. In a typical flip-chip process, the metal bumps 150 are first deposited by plating, jetting, stud bumping, direct placement (e.g., ball drop), or screen printing the bumps onto either the die pads on the P-cells or the metal vias. Then the P-cells and the substrates are brought into close contact, and the metal bumps are bonded to both the die pads and the metal vias using heat, pressure, and ultrasonic vibration in a thermosonic process or heat and pressure in a reflow process.

Figure 5:
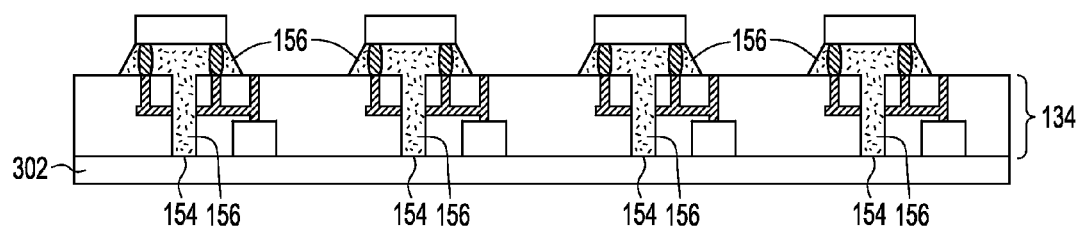
FIG. 5 is a cross-sectional side view illustrating another step in the process for assembling the sensor device of FIGS. 1 and 2 in accordance with an embodiment of the present invention.

FIG. 5 shows a cross-sectional side view of the structure shown in FIG. 4 with the above-described pressure-sensitive gel 156 filling a cavity formed by the flip-chip bonded P-cells 136, the substrate 134, and the metal bumps 150. The gel 156 also fills the openings 154 and might encase each of the metal bumps 150. The gel material may be dispensed into the cavities and openings with a nozzle of a conventional dispensing machine as is known in the art. Because, in this embodiment, the pressure-sensitive active regions of the P-cells 136 are on the same face of the P-cells as the die pads, the gel 156 contacts the pressure-sensitive active regions of the P-cells.

Figure 6:
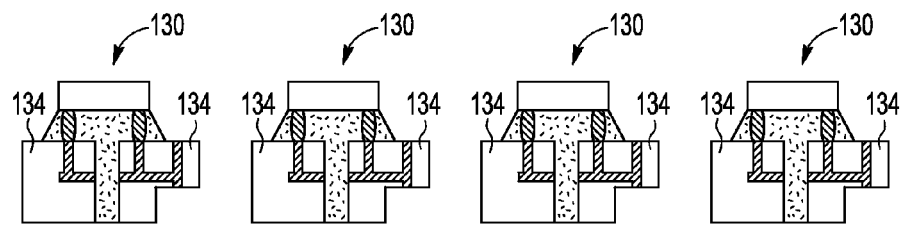
FIG. 6 is a cross-sectional side view illustrating another step in the process for assembling the sensor device of FIGS. 1 and 2 in accordance with an embodiment of the present invention.

FIG. 6 shows a cross-sectional side view of the sensor packages 130 of FIG. 5 after singulation using a saw or laser, during which the sensor substrate 134 is severed into multiple instantiations of the sensor package 130, one of which is shown in FIG. 1. In this embodiment, the singulation occurs at the right-most edge of the trench 348 to form the shelf 148 as shown in FIG. 1. Prior to or after singulation, the backing tape 302 (FIG. 5) is removed. The result is a plurality of pressure sensor packages 130 ready for testing prior to incorporation into device package 100.

Figure 7:
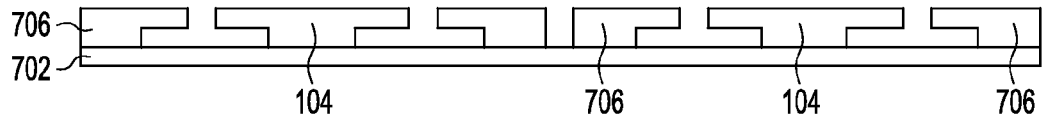
FIG. 7 is a cross-sectional side view illustrating another step in the process for assembling the sensor device of FIGS. 1 and 2 in accordance with an embodiment of the present invention.

FIG. 7 shows a cross-sectional side view of die paddles 104 and metal lead structures 706 that will eventually form leads 106 of multiple instantiations (here, two) of lead frame 102 of FIG. 1. Note that, later in the manufacturing process, singulation will sever each lead structure 706 into two leads 106, one lead for each of two adjacent instantiations of lead frame 102. Die paddles 104 and lead structures 706 are all mounted on suitable lead frame tape 702. For convenience, only two die paddles 104 are shown although, in a real-world manufacturing process, many more such die paddles (and, thus, devices 100) would be processed concurrently in a one- or two-dimensional array.

Figure 8:
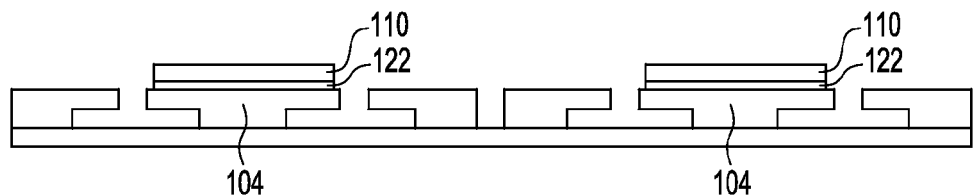
FIG. 8 is a cross-sectional side view illustrating another step in the process for assembling the sensor device of FIGS. 1 and 2 in accordance with an embodiment of the present invention.

FIG. 8 shows a cross-sectional side view of die paddles 104 and metal lead structures 706 of FIG. 7 with MCUs 110 attached to the die paddles 104 by adhesive layer 122, typically an epoxy-based adhesive or other suitable substance (e.g., die-attach tape). In a typical manufacturing process, the MCUs are placed on the adhesive layer 122 using conventional pick-and-place machinery (not shown). Depending on the implementation, the attachment or die-bonding of the MCUs can be achieved in a single die-bonding process step that includes the curing of the adhesive in a single pass through a curing cycle (e.g., by heating or by ultraviolet (UV) irradiation).

Figure 9:
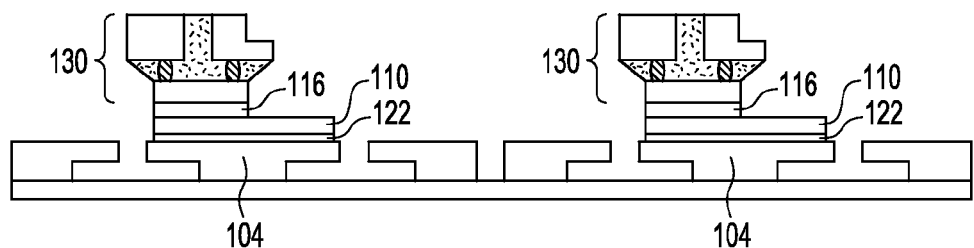
FIG. 9 is a cross-sectional side view illustrating another step in the process for assembling the sensor device of FIGS. 1 and 2 in accordance with an embodiment of the present invention.

FIG. 9 shows a cross-sectional side view of the structure shown in FIG. 8 with a singulated sensor package 130 from FIG. 5 attached to each MCU 110 by an adhesive layer 116. As described above, the sensor packages 130 are placed on the adhesive layer 116 using conventional pick-and-place machinery (not shown). Depending on the implementation, the attachment or die-bonding of the sensor packages to the MCUs can be achieved in a single die-bonding process step that includes the curing of the adhesive in a single pass through a curing cycle (e.g., by heating or by UV irradiation).

Further, the curing step described in connection with FIG. 8 might be combined with this curing step.

Figure 10:
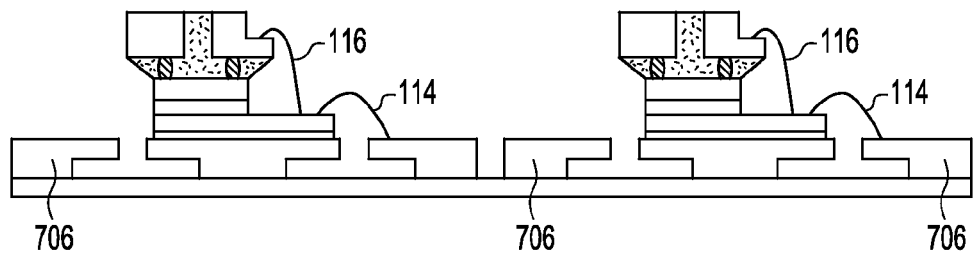
FIG. 10 is a cross-sectional side view illustrating another step in the process for assembling the sensor device of FIGS. 1 and 2 in accordance with an embodiment of the present invention.

FIG. 10 shows a cross-sectional side view of the MCUs 110 of FIG. 9 after being wire-bonded to both and pressure sensor packages 130 and to lead structures 706. Note that (i) the MCUs can be electrically connected to the lead structures and (ii) the pressure sensor packages can be electrically connected to the MCUs all in a single-pass wire-bonding cycle or in a single wire-bonding process step where the sensor package, MCU, and lead structure are connected with one or more single wire bonds.

Figure 11:
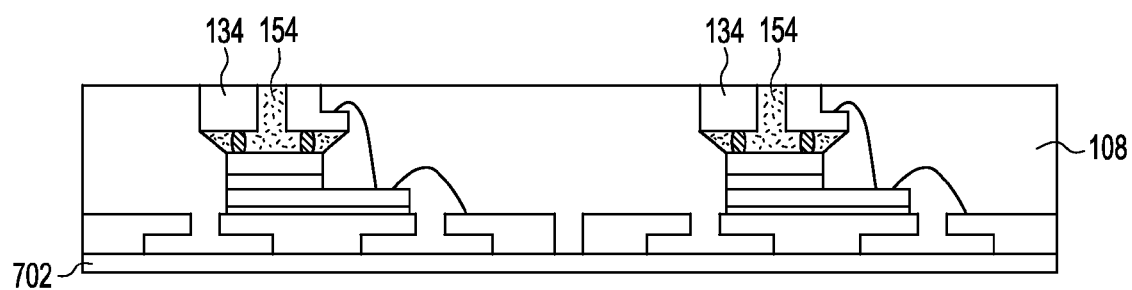
FIG. 11 is a cross-sectional side view illustrating another step in the process for assembling the sensor device of FIGS. 1 and 2 in accordance with an embodiment of the present invention.

FIG. 11 shows a cross-sectional side view of the result of encapsulation with pin molding being applied to the structure of FIG. 10. Although not explicitly depicted in the figures, film or dam is pressed onto the exposed portion (back side) of the sensor substrates 134, and mold pins are pressed on the film, and then molding compound is applied to encapsulate and embed all of the existing elements within molding compound 108, while leaving the back sides on the top of each sensor substrate 134 exposed. The mold pins and the film prevent the molding compound from seeping onto the exposed areas of the sensor substrate and into the openings 154.

In one embodiment, the molding compound is applied using a mold insert of a conventional injection-molding machine, as is known in the art. The molding material is typically applied as a liquid polymer (e.g., uncured epoxy), which is then heated to form a solid in a heated atmosphere or by exposing the uncured epoxy to an ultraviolet light. The molding material can also be a solid that is heated to form a liquid for application and then cooled to form a solid mold. Subsequently, an oven is used to cure the molding material to complete the cross linking of the polymer. In alternative embodiments, other encapsulating processes may be used.

Figure 12:
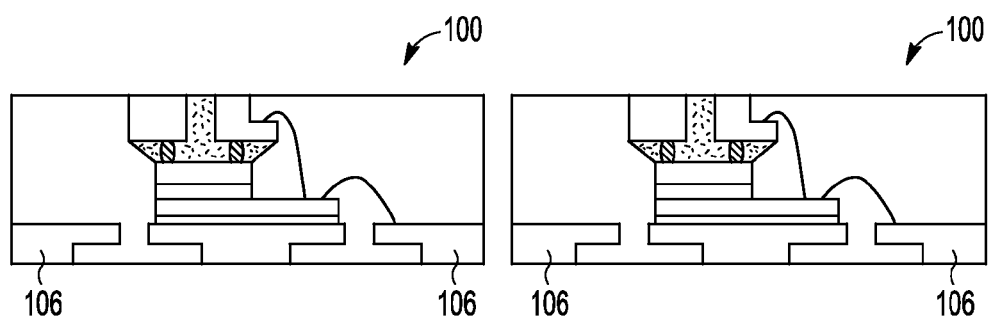
FIG. 12 is a cross-sectional side view illustrating yet another step in the process for assembling the sensor device of FIGS. 1 and 2 in accordance with an embodiment of the present invention.

FIG. 12 shows a cross-sectional side view of the structure of FIG. 11 after removal of lead frame tape 702 and singulation using a saw or laser, during which each lead structure 706 is severed into two leads 106 of adjacent instantiations of sensor device 100. The resulting structure of FIG. 12 consists of multiple instantiations of semiconductor sensor device 100 of FIG. 1.

Although not explicitly depicted in the drawings, in real-world manufacturing, a two-dimensional array of different instantiations of sensor device 100 would be assembled on a multi-device lead frame that consists of a two-dimensional array of lead frame structures as shown in FIGS. 7-11. The array of sensor devices would then be separated, e.g., in a singulation process involving a saw or laser such as that described in connection with FIG. 12, to form individual instantiations of sensor device 100. The foregoing also applies to the formation of the pressure sensor packages 130 as shown in FIGS. 3-5.

As used herein, the term "mounted to" as in "a first die mounted to a die paddle" covers situations in which the first die is mounted directly to the lead frame with no other intervening dies or other structures except an adhesive layer (as in the mounting of the MCU 110 to the die paddle 104 using the adhesive layer 122 in FIG. 1) as well as situations in which the first die is directly mounted to another die, which is itself mounted directly to the die paddle. An example of this latter situation would be an embodiment in which another sensor die, such as a G-cell die, is mounted onto an MCU die, and the MCU is in turn mounted to a die paddle, in which case the other die could be said to be "mounted to" the die paddle, albeit via the MCU die. Note that "mounted to" also covers situations in which there are two or more intervening dies between the first die and lead frame. Depending on the situation, the term "mounted" can imply electrical connection in addition to physical attachment, where the electrical connection may be provided by one or more bond wires, one or more metal bumps, and/or any other suitable technique.

By now it should be appreciated that there has been provided an improved packaged semiconductor sensor device and a method of forming the improved packaged semiconductor sensor device. Circuit details are not disclosed because knowledge thereof is not required for a complete understanding of the invention.

Although the invention has been described using relative terms such as "front", "back", "top", "bottom", "over", "above", "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A semiconductor sensor device, comprising:
a device substrate;
a micro controller unit (MCU) die attached to the device substrate;
a pressure sensor package having a sensor substrate and a pressure sensor die electrically connected to the sensor substrate, the sensor substrate having a front side with the pressure sensor die attached thereto, a back side, and an opening from the front side to the back side, wherein the pressure sensor die is flip-chip mounted to the sensor substrate using conductive bumps, and the sensor device further comprises a pressure-sensitive gel covering the conductive bumps and the pressure sensor die, and at least partially filling the opening in the sensor substrate; and
a molding compound encapsulating the MCU die, the device substrate, and the pressure sensor package, the molding compound having an outer surface;
wherein the back side of the sensor substrate and the opening in the sensor substrate are exposed on the outer surface of the molding compound.

2. The sensor device of claim 1, wherein:
the device substrate is a lead frame comprising a die paddle and at least one lead;
the MCU die is attached to the die paddle by an adhesive layer; and
the MCU die is electrically connected to the at least one lead with at least one bond wire.

3. The sensor device of claim 1, wherein the pressure sensor die is attached to the MCU using a layer of adhesive.

4. The sensor device of claim 1, further comprising:
another sensor die attached to the device substrate and electrically connected to the MCU with additional bond wires.

5. A semiconductor sensor device comprising:
a device substrate;
a micro controller unit (MCU) die attached to the device substrate;
a pressure sensor package having a sensor substrate and a pressure sensor die electrically connected to the sensor substrate, the sensor substrate having a front side with the pressure sensor die attached thereto, a back side, and an opening from the front side to the back side; and
a molding compound encapsulating the MCU die, the device substrate, and the pressure sensor package, the molding compound having an outer surface,
wherein the back side of the sensor substrate and the opening in the sensor substrate are exposed on the outer surface of the molding compound, and wherein the sensor substrate comprises:
first and second insulating layers;
patterned traces disposed between the first and second insulating layer;
a first set of metal vias disposed in the first insulating layer and connecting to the patterned traces, the first set of metal vias having exposed ends on the front side of the sensor substrate; and
metal bumps on the exposed ends of the first set of metal vias, wherein the metal bumps electrically connect the pressure sensor die to exposed ends of the first set of metal vias on the sensor substrate.

6. The sensor device of claim 5, wherein the sensor substrate further comprises:
a second set of vias disposed in the first and insulating layers and connecting to the patterned traces;
wherein a portion of the second insulating layer is absent, thereby exposing ends of the second set of vias to form substrate bond pads connected to the patterned traces, and
wherein the MCU die is electrically connected to the substrate bond pads on the exposed end portions of the second set of vias.

7. The sensor device of claim 6, wherein a portion of the second insulating layer is absent thereby exposing a portion of the patterned traces and substrate bond pads connected to the patterned traces, and wherein the MCU die is electrically connected to the substrate bond pads on the sensor substrate.

* * * * *